United States Patent
Yoshida et al.

(10) Patent No.: US 9,893,656 B2
(45) Date of Patent: Feb. 13, 2018

(54) RESONANT TRANSDUCER AND MANUFACTURING METHOD OF RESONANT TRANSDUCER

(71) Applicant: YOKOGAWA ELECTRIC CORPORATION, Musashino-shi, Tokyo (JP)

(72) Inventors: Takashi Yoshida, Musashino (JP); Shigeto Iwai, Musashino (JP); Yoshitaka Sasaki, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 883 days.

(21) Appl. No.: 14/153,325

(22) Filed: Jan. 13, 2014

(65) Prior Publication Data
US 2014/0197712 A1 Jul. 17, 2014

(30) Foreign Application Priority Data
Jan. 11, 2013 (JP) .................................. 2013-003414

(51) Int. Cl.
*H02N 11/00* (2006.01)
*H03H 3/007* (2006.01)
*H03H 9/24* (2006.01)

(52) U.S. Cl.
CPC ........... *H02N 11/00* (2013.01); *H03H 3/0072* (2013.01); *H03H 9/2463* (2013.01); *Y10T 29/49007* (2015.01)

(58) Field of Classification Search
CPC .... H02N 11/00; H02N 11/002; H02N 11/008; H03H 3/0072; H03H 9/2463; Y10T 29/49007

USPC ............................ 310/300, 309, 311; 29/595
See application file for complete search history.

(56) References Cited

U.S. PATENT DOCUMENTS

| | | | |
|---|---|---|---|
| 6,191,007 B1 * | 2/2001 | Matsui | H01L 21/76243 257/E21.133 |
| 6,849,546 B1 | 2/2005 | Tu et al. | |
| 7,923,278 B2 * | 4/2011 | Lutz | B81C 1/00269 438/50 |
| 2005/0242904 A1 * | 11/2005 | Lutz | H03H 3/0077 333/200 |

(Continued)

FOREIGN PATENT DOCUMENTS

| | | | | |
|---|---|---|---|---|
| CN | 102671851 A | | 9/2012 | |
| EP | 2428783 A1 * | | 3/2012 | G01L 1/106 |

(Continued)

OTHER PUBLICATIONS

Communication issued Oct. 27, 2016, issued by the State Intellectual Property Office of the People's Republic of China in counterpart Chinese Patent Application No. 201410012729.0.

(Continued)

*Primary Examiner* — Bernard Rojas
*Assistant Examiner* — Rashad Johnson
(74) *Attorney, Agent, or Firm* — Sughrue Mion, PLLC

(57) ABSTRACT

A resonant transducer includes a resonator, a resonator electrodes connected to an end part of the resonator, at least one fixed electrode arranged in the vicinity of the resonator, and a buried part formed between the fixed electrode and the resonator electrode. The resonator, the resonator electrodes and the fixed electrode are formed by the same active layer on a substrate.

12 Claims, 18 Drawing Sheets

(56) References Cited

U.S. PATENT DOCUMENTS

| | | | |
|---|---|---|---|
| 2007/0042521 A1* | 2/2007 | Yama | B81C 1/00333 438/48 |
| 2008/0122020 A1 | 5/2008 | Metz et al. | |
| 2009/0017579 A1* | 1/2009 | Jeong | B81C 1/00039 438/106 |
| 2010/0109810 A1* | 5/2010 | Hashimura | H03H 9/02244 333/197 |
| 2010/0127596 A1* | 5/2010 | Ayazi | H03H 3/0077 310/300 |
| 2012/0235257 A1* | 9/2012 | Yoshida | G01L 1/106 257/418 |
| 2014/0264657 A1* | 9/2014 | Gogoi | H01L 27/14 257/416 |
| 2015/0042208 A1* | 2/2015 | Yoshida | H03H 3/0072 310/321 |
| 2016/0061857 A1* | 3/2016 | Yoshida | G01P 15/097 73/514.29 |
| 2016/0137485 A1* | 5/2016 | Graham | B81C 1/00095 257/773 |

FOREIGN PATENT DOCUMENTS

| | | |
|---|---|---|
| JP | 2002289875 A | 10/2002 |
| JP | 2009060457 A | 3/2009 |
| JP | 201258127 A | 3/2012 |

OTHER PUBLICATIONS

Extended European Research Report dated Mar. 24, 2017, issued by the European Patent Office in counterpart European Application No. 14150833.3.

Seong Yeol NO et al: "The HARPSS Process for Fabrication of Nano-Precision Silicon Electromechanical Resonators", Proceedings of the 2001 1st IEEE Conference of Nanotechnology October, 28-30, 2001, Maui, Hawaii, Jan. 1, 2001 (Jan. 1, 2001), pp. 489-494, XP055354481, (6 pages total).

\* cited by examiner

MASK PATTERN OF ACTIVE LAYER 320

FIG.20A  A-A  B-B
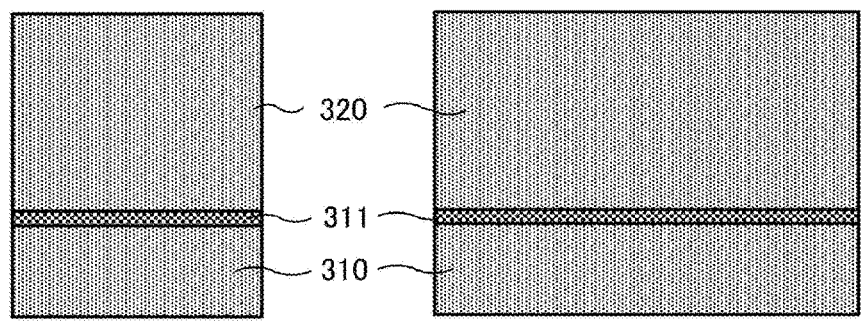
FIG.20B
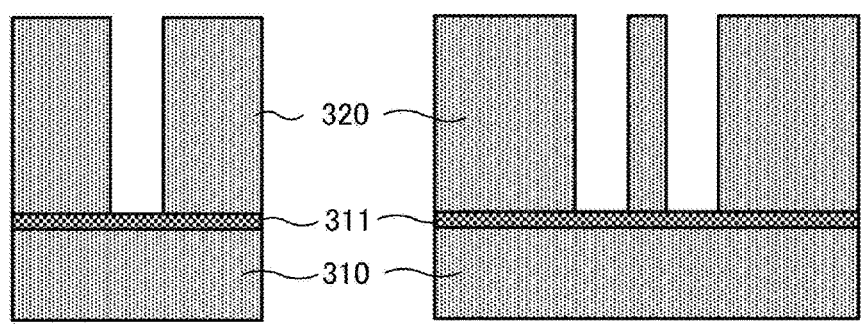
FIG.20C
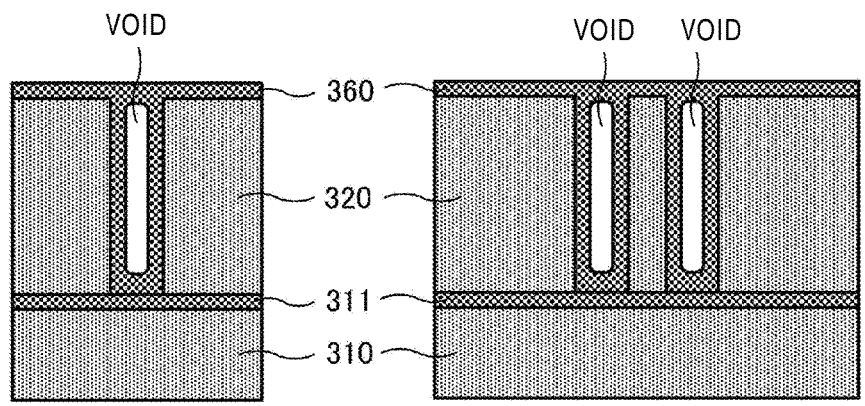

RESONANT TRANSDUCER AND MANUFACTURING METHOD OF RESONANT TRANSDUCER

CROSS-REFERENCE TO RELATED APPLICATION(S)

The present application claims the benefit of priority of Japanese Patent Application No. 2013-003414, filed on Jan. 11, 2013. The disclosures of the application are incorporated herein by reference.

BACKGROUND

Technical Field

The present disclosure relates to a resonant transducer, and more particularly to an electrode separating structure which ensures insulation between electrodes.

Related Art

A resonant transducer is a device which detects a change of a resonance frequency of a resonator formed on a silicon substrate to measure an applied physical quantity. The resonant transducer is widely used for a transmitter or the like as MEMS (Micro Electro Mechanical Systems) devices such as a pressure sensor, an acceleration sensor, an angular velocity sensor, an oscillator, etc.

In the resonant transducer, a plane side of a long plate shaped resonator both ends of which are fixed is formed in parallel with a silicon substrate and the resonator is vibrated in a vertical direction of the silicon substrate. However, patent literature 1 discloses that a plane side of a resonator is formed vertically to a silicon substrate and the resonator is vibrated in a transverse direction of the silicon substrate. Thus, a manufacturing process is simplified, so that the resonant transducer can be highly accurately and inexpensively manufactured.

FIG. 18 is a diagram for explaining a structure of a resonant transducer in which a plane side of a long plate shaped resonator is formed vertically to a silicon substrate to vibrate the resonator in a transverse direction of the silicon substrate. FIG. 18 shows a sectional view of a resonator part.

As shown in FIG. 18, in the resonant transducer 300, an SOI substrate has a structure in which a BOX layer 311 made of an oxide film is inserted between the silicon substrate 310 and a surface silicon layer (a lower part of an active layer 320). On the SOI substrate, the resonator 330, a first fixed electrode 341 and a second fixed electrode 342 are formed by processing the active layer 320 made of silicon. An oxide film 360 and a shell 351 made of polysilicon 350 are formed.

The first fixed electrode 341 and the second fixed electrode 342 are formed so as to sandwich the resonator 330 between them. In a periphery of the resonator 330, a vacuum chamber 370 is formed. Electrodes are also formed in end sides of the resonator 330, which are not shown in FIG. 18, and function as resonator electrodes 331.

FIG. 19 is a diagram showing an example of a mask pattern of the active layer 320. The first fixed electrode 341 and the second fixed electrode 342 are electrodes which apply positive and negative bias voltages having the same magnitude or level. The resonator electrodes 331 are electrodes which apply an ac signal of a frequency equal to a resonance frequency of the resonator 330. In this case, however, combinations of voltages and signals applied respectively to the electrodes may be changed. Further, the number of the fixed electrodes may be sometimes set to one.

Since the resonator 330 and the resonator electrodes 331 need to be insulated from the first fixed electrode 341 and the second fixed electrode 342, in the mask pattern, electrode separating gaps WH are provided between the first fixed electrode 341 and the resonator electrodes 331. The electrode separating gaps WH are also provided between the second fixed electrode 342 and the resonator electrode 311. Between the first fixed electrode 341 and the resonator 330, resonator gaps WV are provided. The resonator gaps WV are also provided between the second fixed electrode 342 and the resonator 330. Since an etching rate of a dry etching for separating the active layer 320 is set to be the same rate, the electrode separating gap WH and the resonator gap WV have the same width.

FIGS. 20A to 20C and FIGS. 21A to 21C are diagrams which explain manufacturing processes of the resonant transducer 300 and show an A-A section including the electrode separating gap WH and a B-B section including the resonator gap WV in FIG. 19.

As shown in FIG. 20A, on the initial active layer of the SOI substrate including the substrate 310, the BOX layer 311 and the active layer, an epitaxial growth of a silicon layer including high concentration boron is made to form the active layer 320.

Then, the dry etching of the active layer 320 is carried out by using the above-described mask pattern. As a result, as shown in FIG. 20B, trenches which separate the active layer 320 are formed.

In order to carry out a photolithography with a line narrow in width which forms an etching channel in a manufacturing process afterward, a surface of a wafer needs to be kept flat. Thus, as shown in FIG. 20C, the trenches which separate the active layer 320 are buried by the oxide film 360. The trenches are buried by the oxide film 360 through plasma CVD or an LP-CVD. However, since opening parts of the trenches are narrow, voids (spaces) are ordinarily formed in the buried parts.

Further, as shown in FIG. 21A, a film of polysilicon 350 is formed and the surface of the wafer is flattened. Then, as shown in FIG. 21B, the etching channel is formed in the vicinity of the resonator 330. The etching channel serves as an introducing opening of etching liquid or etching gas for removing the oxide film 360 in the periphery of the resonator 330, that is, a sacrifice layer.

Then, as shown in FIG. 21C, the sacrifice layer is etched by using the etching channel to release the resonator 330. After that, a vacuum seal is made by forming the polysilicon film under a prescribed environment to bury the etching channel and form the vacuum chamber 370. Further, holes and electrode pads are formed through which the electrodes are respectively allowed to come into contact. Thus, the resonant transducer 300 shown in FIG. 18 is manufactured.

PRIOR ART LITERATURE

Patent Literature

[Patent Literature 1] JP-A-2012-58127

FIG. 22A is a horizontally sectional view of the active layer 320 before the sacrifice layer is etched. As shown in FIG. 22A, parts between the resonator 330 and the first fixed electrode 341, and the second fixed electrode 342, and parts between the resonator electrode 331 and the first fixed electrode 341, and the second fixed electrode 342 are buried by the oxide films 360. In the oxide films 360, the voids are continuously formed.

When the sacrifice layer is etched by using the etching channel shown by a broken line in the drawing, as shown in FIG. 22B, the oxide film 360 is removed to form the resonator gaps between the resonator 330 and the first fixed electrode 341, and the second fixed electrode 342. Thus, the resonator 330 is released.

At this time, since the voids are continuously formed in the oxide films 360, the oxide films 360 between the resonator electrode 331 and the first fixed electrode 341, and the second fixed electrode 342 are also etched and removed through the voids. As a result, gaps are similarly formed between the resonator electrode 331 and the first fixed electrode 341, and the second fixed electrode 342.

Due to the gaps, there is a fear that insulation is not probably sufficiently ensured between the resonator electrode 331 and the first fixed electrode 341, and the second fixed electrode 342. For instance, when a foreign material enters a part between the resonator electrode 331 and the first fixed electrode 341, or the second fixed electrode 342 during the manufacturing process, there is a fear that the insulation between the electrodes may be probably insufficient to deteriorate a quality.

Further, when an etching process advances to the BOX layer 311 in a lower surface side of the electrode through the voids, the electrodes partly float, so that the insulation between the electrodes is not also sufficiently ensured.

When the oxide film 360 is formed, a method may be considered in which the trenches are buried by the oxide film without forming the voids to prevent the etching process from advancing through the voids and ensure the insulation between the electrodes. However, for instance, when a tapered structure is formed, a trench structure having a high aspect ratio is hardly formed. Thus, the manufacturing processes are complicated, which causes a production cost to increase.

SUMMARY

Exemplary embodiments of the invention provide a resonant transducer which can ensure insulation between electrodes without increasing a production cost.

A resonant transducer according to an exemplary embodiment of invention comprises:
a resonator;
a resonator electrode connected to an end part of the resonator;
a fixed electrode arranged in the vicinity of the resonator; and
a buried part formed between the fixed electrode and the resonator electrode,
wherein the resonator, the resonator electrode and the fixed electrode are formed by the same active layer on a substrate.

A resonant transducer according to an exemplary embodiment of invention comprises:
a resonator;
a resonator electrode connected to an end part of the resonator;
a fixed electrode arranged in the vicinity of the resonator;
an outer peripheral electrode arranged in outer peripheries of the resonator electrode and the fixed electrode; and
a buried part formed between any of the electrodes,
wherein the resonator, the resonator electrode, the fixed electrode and outer peripheral electrode are formed by the same active layer on a substrate.

The buried part may be made of polysilicon.

The buried part of the polysilicon may be doped with impurities and connected to a reference potential.

The buried part may be made of a material which can withstand vapor of hydro-fluoric acid or hydrogen fluoride.

The material may be any of SiC, SiGe or DLC.

A method of manufacturing a resonant transducer including a resonator, a resonator electrode connected to an end part of the resonator and a fixed electrode arranged in the vicinity of the resonator, which are formed by the same active layer on a substrate, may comprise:
burying polysilicon in parts between the fixed electrode and the resonator electrode; and
etching a sacrifice layer to release the resonator.

A method of manufacturing a resonant transducer including a resonator, a resonator electrode connected to end parts of the resonator, a fixed electrode arranged in the vicinity of the resonator and an outer peripheral electrode arranged in outer peripheries of the resonator electrode and the fixed electrode, which are formed by the same active layer on a substrate, may comprise:
burying polysilicon in parts between any of the electrodes; and
etching a sacrifice layer to release the resonator.

According to the exemplary embodiments of the invention, it is possible to provide a resonant transducer which can ensure insulation between electrodes without increasing a production cost.

BRIEF DESCRIPTION OF THE DRAWINGS

FIGS. 20A to 20C are diagrams which explain manufacturing processes of the resonant transducer.

DETAILED DESCRIPTION

Figure 1A:
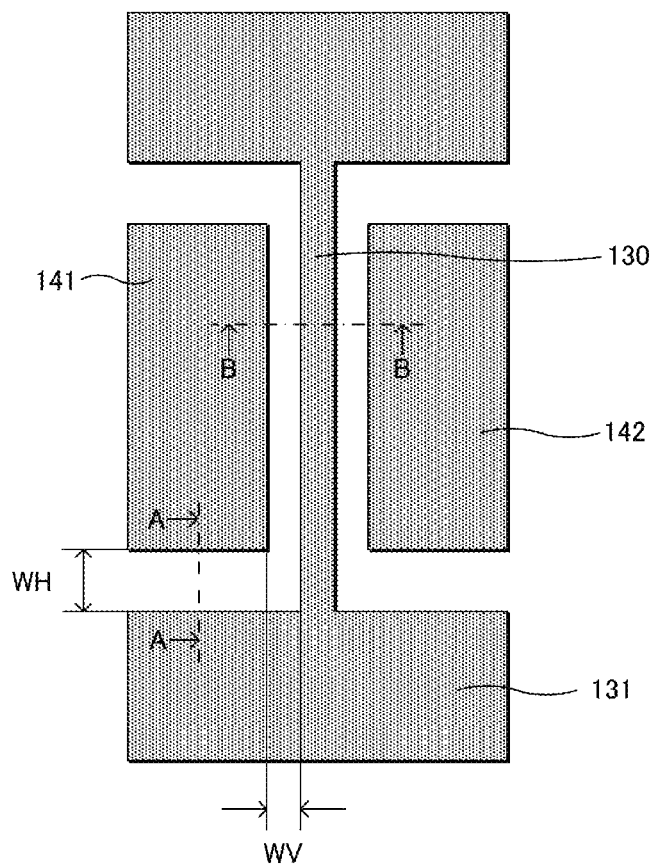
FIGS. 1A to 1C are diagrams which explain a structure of a resonant transducer according to an exemplary embodiment.
Figures 1B, 1C:
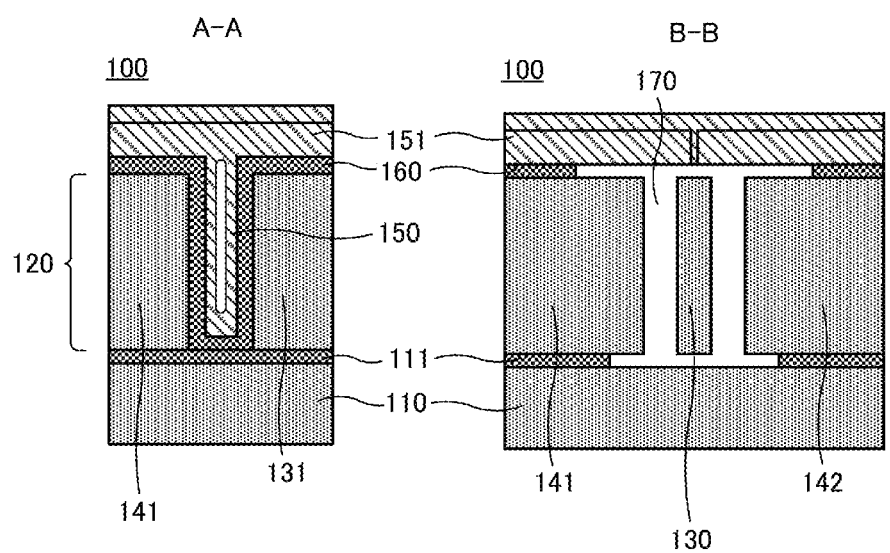

Now, an exemplary embodiment of the present invention will be described below by referring to the drawings. FIG. 1 is a diagram which explains a structure of a resonant transducer according to the exemplary embodiment. FIG. 1A shows a mask pattern of an active layer. FIG. 1B shows an A-A section including an electrode separating gap WH. FIG. 1C shows a B-B section including a resonator gap WV.

As show in FIG. 1, the resonant transducer 100 has a structure, like the related-art resonant transducer 300, that on an SOI substrate having a structure in which a BOX layer 111 made of an oxide film is inserted between a silicon substrate 110 and a surface silicon layer 120, a resonator 130, a resonator electrode 131, a first fixed electrode 141 and a second fixed electrode 142 are formed by processing an active layer 120 made of silicon, and further, an oxide film 160 and a shell 151 made of polysilicon 150 are formed.

The first fixed electrode 141 and the second fixed electrode 142 are formed so as to sandwich the resonator 130 between them. In a periphery of the resonator 130, a vacuum chamber 170 is formed.

The resonant transducer 100 of the present exemplary embodiment has a different structure, as shown in FIG. 1B, from that of the related-art resonant transducer 300 in view of a point that a buried layer of the polysilicon 150 is formed between the resonator electrode 131 and the first fixed electrode 141. In this case, a material may be used which can withstand vapor of hydro-fluoric acid or hydrogen fluoride, for instance, SiC, SiGe, DLC (Diamond-Like Carbon) etc. in place of the polysilicon.

In the case of the mask pattern shown in FIG. 1, a buried layer of the polysilicon 150 is also formed between the resonator electrode 131 and the second fixed electrode 142. However, when the resonator 130 and the resonator electrode 131 are not formed in "the shape of H", but in "the shape of inverted U" or the like so that the electrode separating gap is not provided between the resonator electrode 131 and the second fixed electrode 142 or when the second fixed electrode is not used, the buried layer of the polysilicon 150 may be satisfactorily formed between the resonator electrode 131 and the first fixed electrode 141.

The buried layer of the polysilicon 150 functions as an etching stop layer when a sacrifice layer is etched. Accordingly, the oxide film 160 in the periphery of the buried layer of the polysilicon 150 is not completely removed during the etching of the sacrificed layer and a part or an entire part of the oxide film is left. Thus, since a part between the electrodes is buried and protected by an insulator, insulation between the electrodes is ensured.

In the present exemplary embodiment, in order to form the buried layer of the polysilicon 150, the electrode separating gap WH is formed to be larger than the resonator gap WV so that the oxide film 160 is opened in the electrode separating gap WH when the oxide film 160 is formed. The polysilicon is buried from the opening part. Since other conditions can be made to be the same as those of the related-art resonant transducer, even when the insulation between the electrodes is ensured, a production cost is not increased.

Figure 2A:
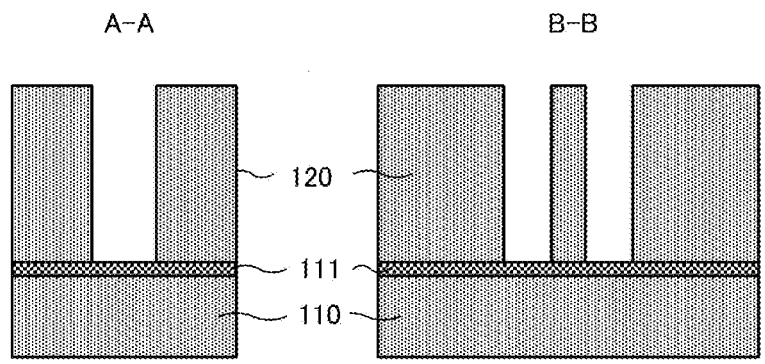
FIGS. 2A to 2C are diagrams which explain a feature part of manufacturing processes of the resonant transducer of the exemplary embodiment.

FIG. 2 is a diagram which explains a feature part of manufacturing processes of the resonant transducer 100 of the present exemplary embodiment. When a dry etching process is applied to the active layer 120 formed on the substrate 110 with the BOX layer 111 sandwiched between them by using the mask pattern shown in FIG. 1A, as shown in FIG. 2A, trenches for separating the active layer 120 are formed. Here, a width of the trench shown in the A-A sectional view is larger than each of widths of the two trenches shown in the B-B sectional view.

Figure 2B:
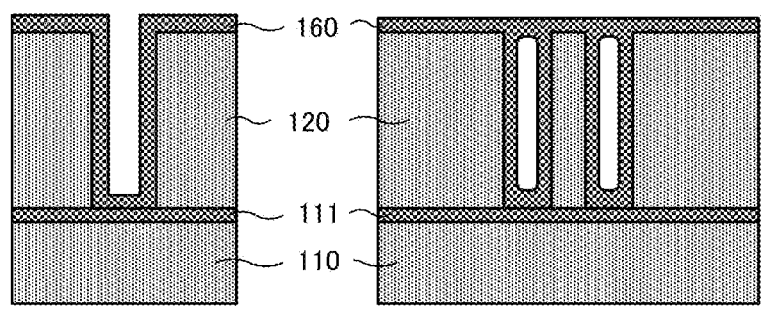

Then, when the oxide film 160 is formed by plasma CVD or an LP CVD, as shown in FIG. 2B, resonator gap parts are buried by the oxide film 160 and voids are formed. However, since the electrode separating gap WH part is large in its width, the electrode separating gap is not buried by the oxide film 160 to form a groove covered with the oxide film 160.

Figure 2C:
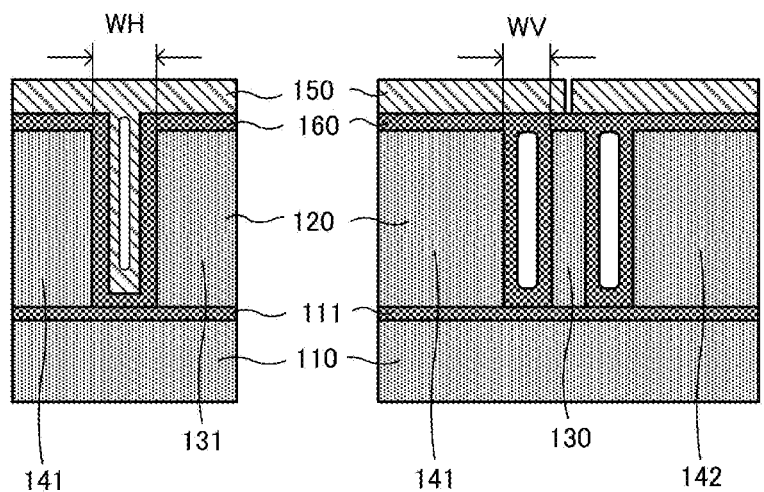

Further, as shown in FIG. 2C, a film of the polysilicon 150 is formed on the surface of the oxide film 160 to form an etching channel in the vicinity of the resonator 130. The electrode separating gap WH part is buried by the polysilicon 150 to form a void. However, since a surface is flat, a photolithography in a process for forming the etching channel is not influenced.

Figure 3:
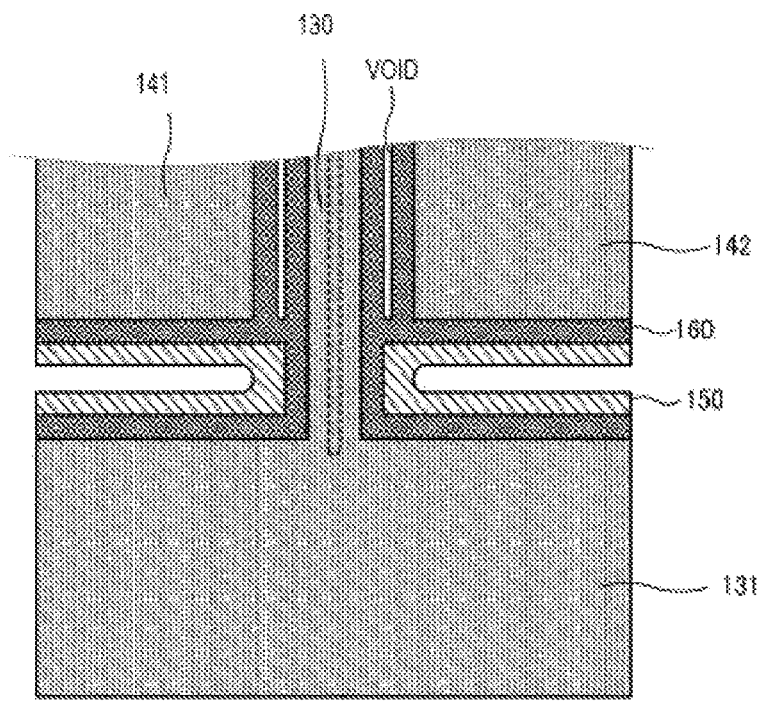
FIG. 3 is a horizontally sectional view of an active layer before a sacrifice layer is etched.

FIG. 3 is a horizontally sectional view of the active layer 120 before the sacrifice layer is etched. As shown in FIG. 3, parts between the resonator 130 and the first fixed electrode 141, and the second fixed electrode 142 are buried by the oxide films 160 having the voids formed. However, between the resonator electrode 131 and the first fixed electrode 141, and the second fixed electrode 142, the polysilicon 150 is buried in the oxide films 160.

Figure 4:
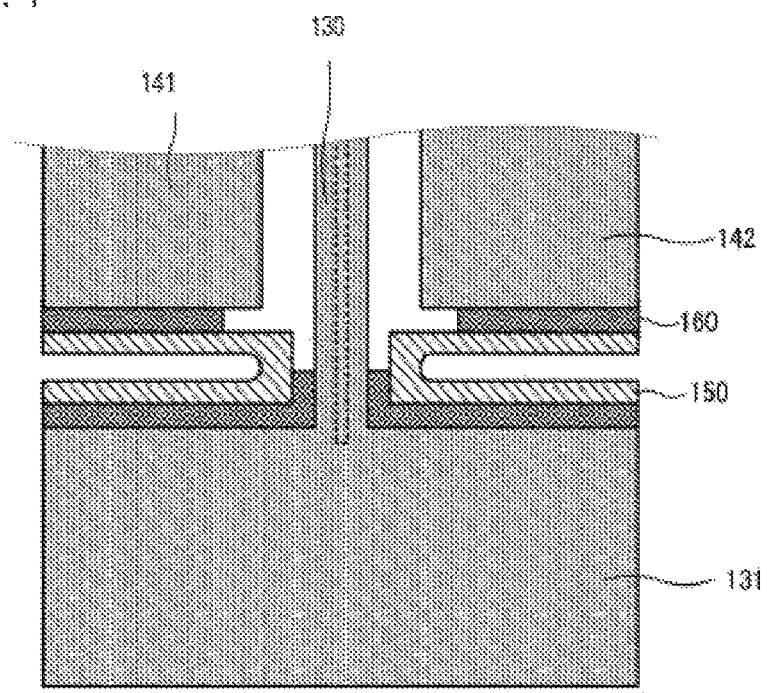
FIG. 4 is a horizontally sectional view of the active layer after the sacrifice layer is etched.

Accordingly, when the sacrifice layer is etched by using the etching channel shown by a broken line in the drawing, as shown in FIG. 4, the resonator gaps are formed between the resonator 130 and the first fixed electrode 141, and the second fixed electrode 142 so that the resonator 130 is released. On the other hand, between the resonator electrode 131 and the first fixed electrode 141, and the second fixed electrode 142, the polysilicon 150 serves as the etching stop layer to leave the oxide film 160.

Accordingly, the insulation between the first fixed electrode 141 and the resonator electrode 131, and between the second fixed electrode 142 and the resonator electrode 131 is ensured. Further, the BOX layer 111 on a lower surface of the resonator electrode 131 can be prevented from being excessively removed so that the resonator electrode 131, the first fixed electrode 141 or the second fixed electrode 142 partly floats.

Figure 5:
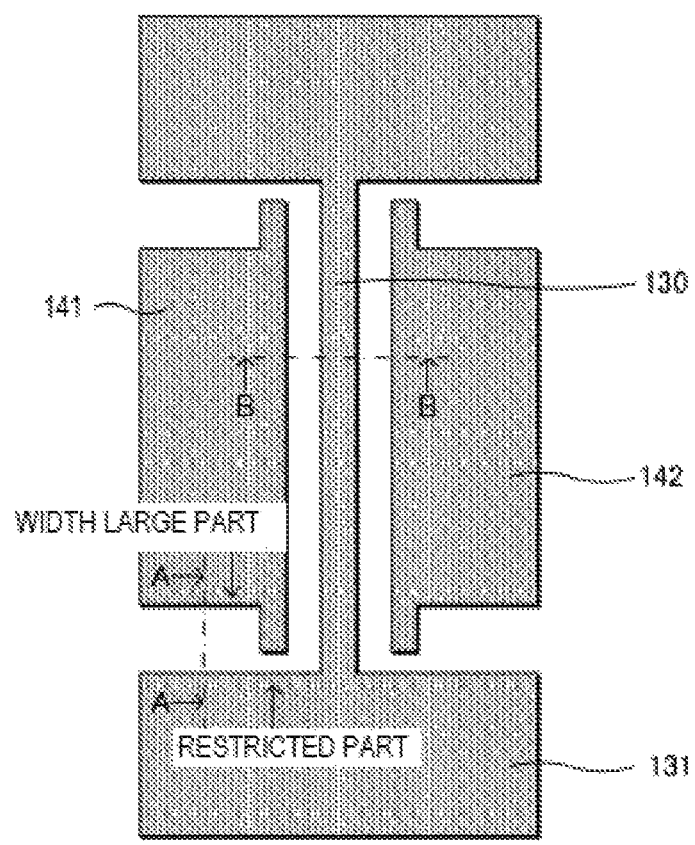
FIG. 5 is a diagram showing a first another example of a mask pattern of the resonant transducer according to the exemplary embodiment.

The mask pattern of the resonant transducer 100 according to the present exemplary embodiment is not limited to such a form as shown in FIG. 1A. FIG. 5 is a diagram showing a first another example of the mask pattern of the resonant transducer 100 according to the present exemplary embodiment.

In the first another example, an electrode separating gap between a first fixed electrode 141 and a second fixed electrode 142 and a resonator electrode 131 is not set to a fixed width, and a restricted part is provided in a part near a resonator 130. In the electrode separating gap, a part except the restricted part is set as a width large part. In the width large part, when an oxide film 160 is formed, the oxide film 160 is opened in the electrode separating gap WH. An A-A section and a B-B section are the same as those of the above-described exemplary embodiment.

Figure 6:
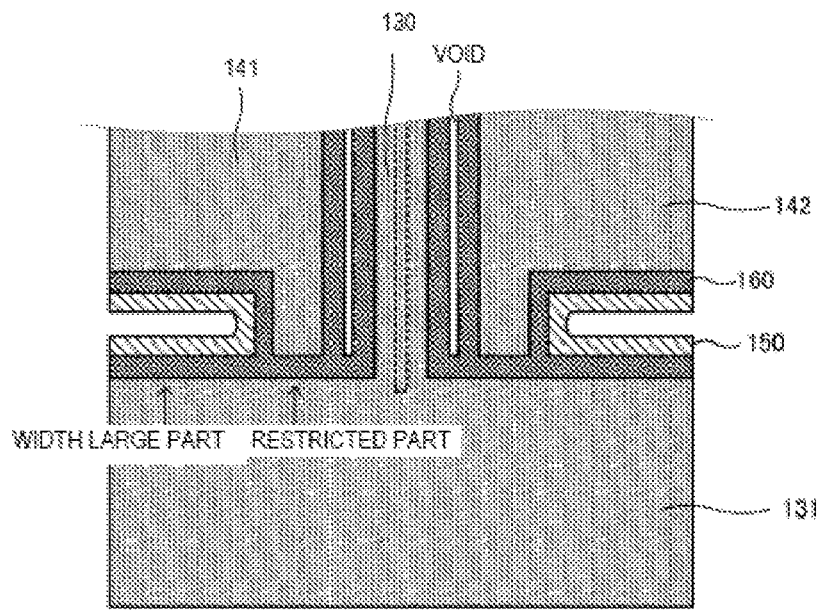
FIG. 6 is a horizontally sectional view of an active layer before a sacrifice layer is etched in the first another example.

FIG. 6 is a horizontally sectional view of an active layer 120 before a sacrifice layer is etched in the first another example. As shown in FIG. 6, parts between the resonator 130 and the first fixed electrode 141, and the second fixed electrode 142 are buried by the oxide films 160 having voids generated. However, in the width large parts between the resonator electrode 131 and the first fixed electrode 141, and the second fixed electrode 142, polysilicon 150 is buried in the oxide films 160. Further, the restricted parts in the parts near the resonator 130 are buried by the oxide films 160. Since the restricted parts are exposed to the width large parts, the oxide film 160 is completely formed and voids are not formed therein.

Figure 7:
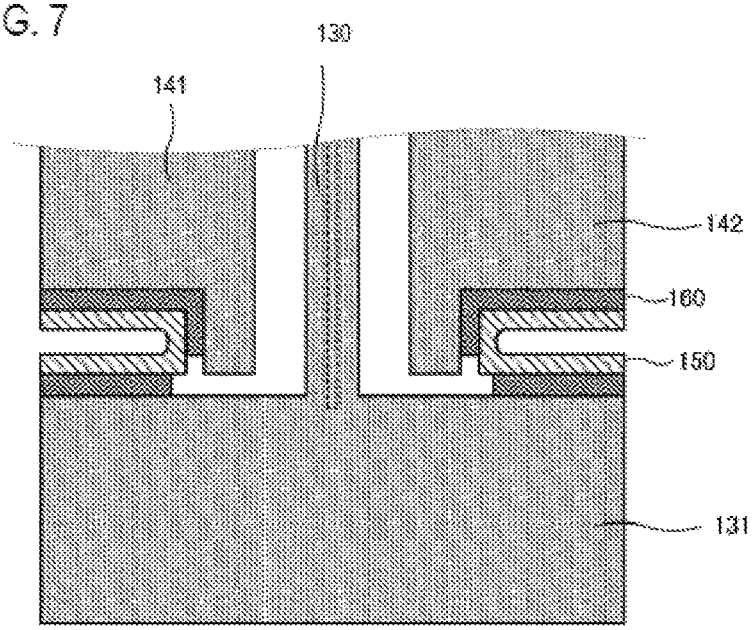
FIG. 7 is a horizontally sectional view of the active layer after the sacrifice layer is etched in the first another example.

Accordingly, when the sacrifice layer is etched by using an etching channel shown by a broken line in the drawing, as shown in FIG. 7, resonator gaps are formed between the resonator 130 and the first fixed electrode 141, and the second fixed electrode 142 so that the resonator 130 is released. On the other hand, between the resonator electrode 131 and the first fixed electrode 141, and the second fixed electrode 142, the polysilicon 150 serves as an etching stop layer to leave the oxide film 160. In the first another example, since the restricted parts are provided which are buried by the oxide films 160, an end part of the resonator 130 can be sufficiently released by etching the sacrifice layer.

In such a way, in the first another example, insulation between the first fixed electrode 141 and the resonator electrode 131, and between the second fixed electrode 142 and the resonator electrode 131 is also ensured. Further, a BOX layer 111 on a lower surface of the resonator electrode 131 can be prevented from being excessively removed so that the resonator electrode 131, the first fixed electrode 141 or the second fixed electrode 142 partly floats.

Figure 8:
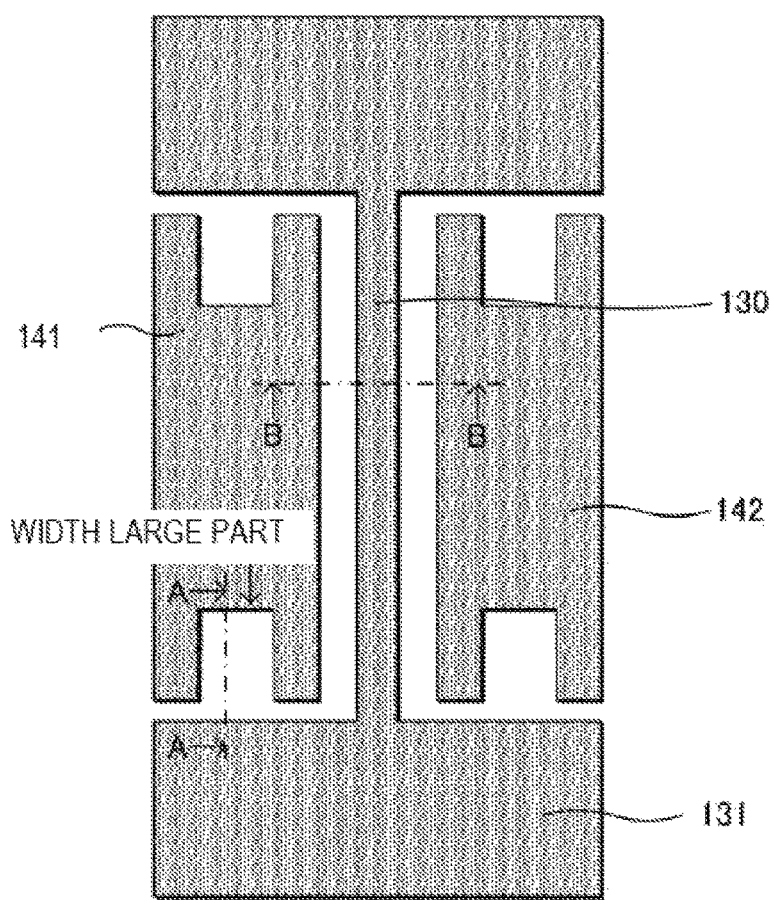
FIG. 8 is a diagram showing a second another example of a mask pattern of the resonant transducer according to the exemplary embodiment.

FIG. 8 is a diagram showing a second another example of the mask pattern of the resonant transducer 100 according to the present exemplary embodiment.

In the second another example, a width large part is partly provided so as to avoid a part near a resonator 130. In the width large part, when an oxide film 160 is formed, the oxide film 160 is opened in an electrode separating gap WH. An A-A section and a B-B section are the same as those of the above-described exemplary embodiment.

Figure 9:
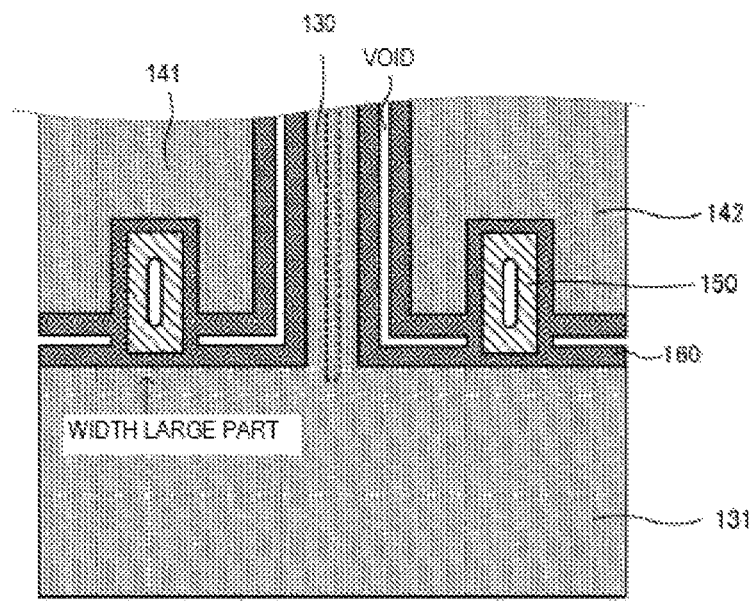
FIG. 9 is a horizontally sectional view of an active layer before a sacrifice layer is etched in the second another example.

FIG. 9 is a horizontally sectional view of an active layer 120 before a sacrifice layer is etched in the second another example. As shown in FIG. 9, parts between the resonator 130 and a first fixed electrode 141, and a second fixed electrode 142 are buried by the oxide films 160 having voids generated. However, in the width large parts between a resonator electrode 131 and the first fixed electrode 141, and the second fixed electrode 142, polysilicon 150 is buried in the oxide films 160. In the peripheries of the width large parts, the oxide films 160 are sufficiently formed and voids are not generated.

Figure 10:
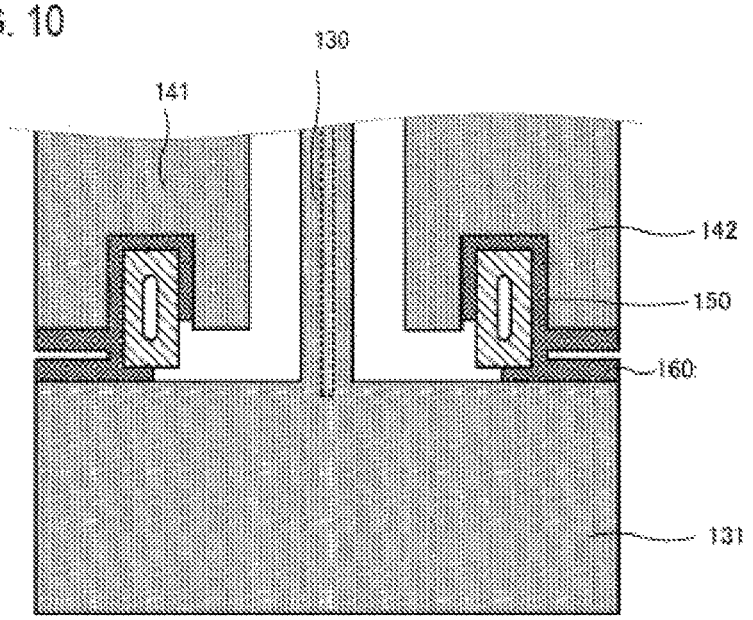
FIG. 10 is a horizontally sectional view of the active layer after the sacrifice layer is etched in the second another example.

Accordingly, when the sacrifice layer is etched by using an etching channel shown by a broken line in the drawing, as shown in FIG. 10, resonator gaps are formed between the resonator 130 and the first fixed electrode 141, and the second fixed electrode 142 so that the resonator 130 is released. On the other hand, between the resonator electrode 131 and the first fixed electrode 141, and the second fixed electrode 142, the polysilicon 150 serves as an etching stop layer to leave the oxide films 160. In the second another example, since base parts of the resonator 130 are likewise buried by the oxide films 160, an end part of the resonator 130 can be adequately released by etching the sacrifice layer.

In such a way, in the second another example, insulation between the first fixed electrode 141 and the resonator electrode 131, and between the second fixed electrode 142 and the resonator electrode 131 is also ensured. Further, a BOX layer 111 on a lower surface of the resonator electrode 131 can be prevented from being excessively removed, so that the resonator electrode 131, the first fixed electrode 141 or the second fixed electrode 142 does not partly float.

Figure 11:
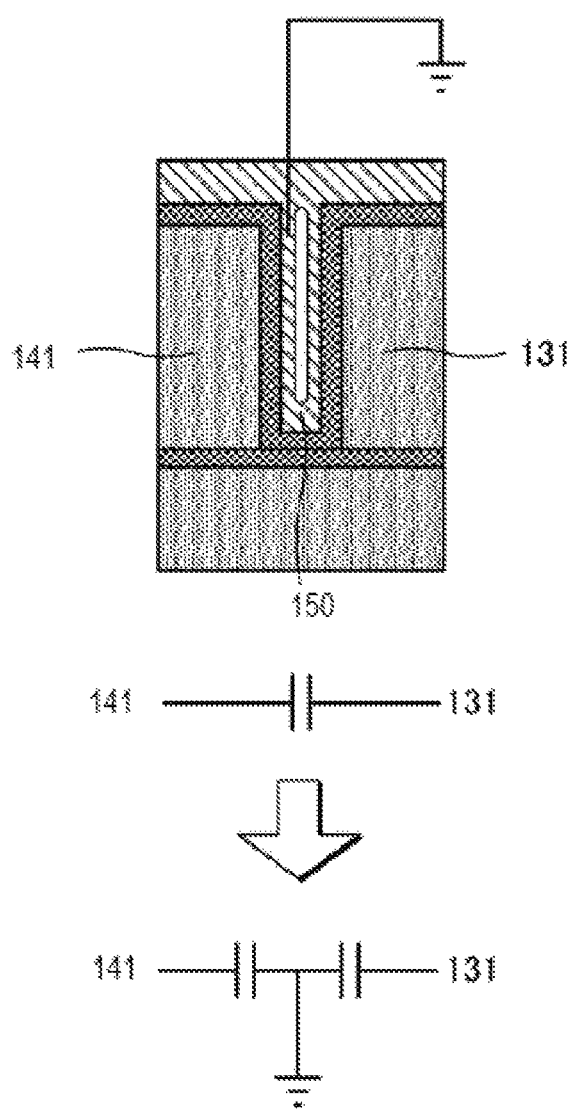
FIG. 11 is a diagram which explains modified examples according to the exemplary embodiment.

In both the above-described exemplary embodiment and the another examples, as shown in FIG. 11, the polysilicon 150 between the resonator electrode 131 and the first fixed electrode 141, and the second fixed electrode 142 may be doped with impurities and connected to a reference potential.

Thus, capacities incidental to parts between the resonator electrode 131 and the first fixed electrode 141, and the second fixed electrode 142 can be eliminated and crosstalk noise generated when an ac signal is supplied between the electrodes can be reduced.

Figure 12:
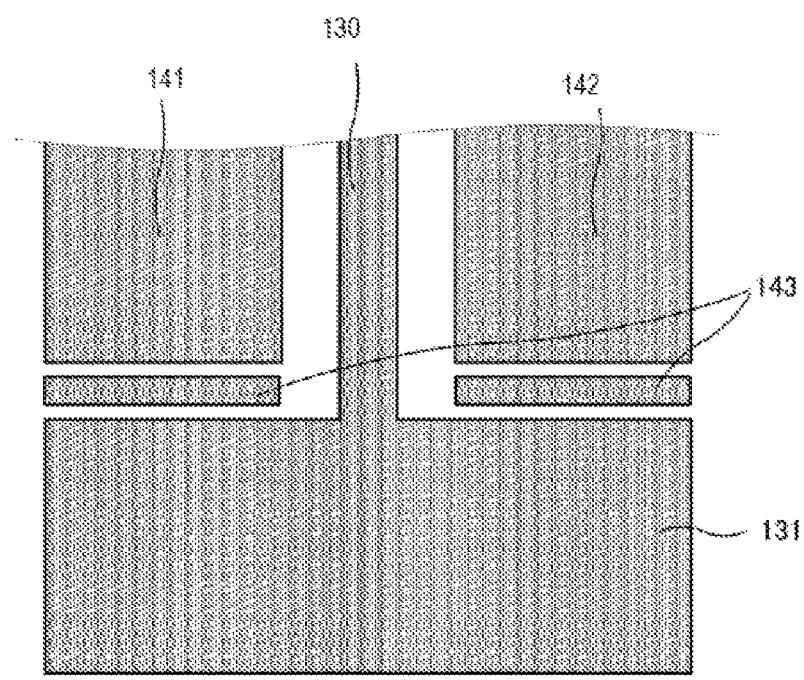
FIG. 12 is a drawing which explains guarding electrodes in the related art.

In the relate-art, in order to eliminate the capacities incidental to the parts between the resonator electrode 131 and the first fixed electrode 141, and the second fixed electrode 142, as shown in FIG. 12, guarding electrodes 143 need to be provided. However, in the above-described exemplary embodiment and the another examples, the polysilicon 150 between the resonator electrode 131 and the first fixed electrode 141, and the second fixed electrode 142 is doped with the impurities so that the same effect may be obtained.

Figure 13:
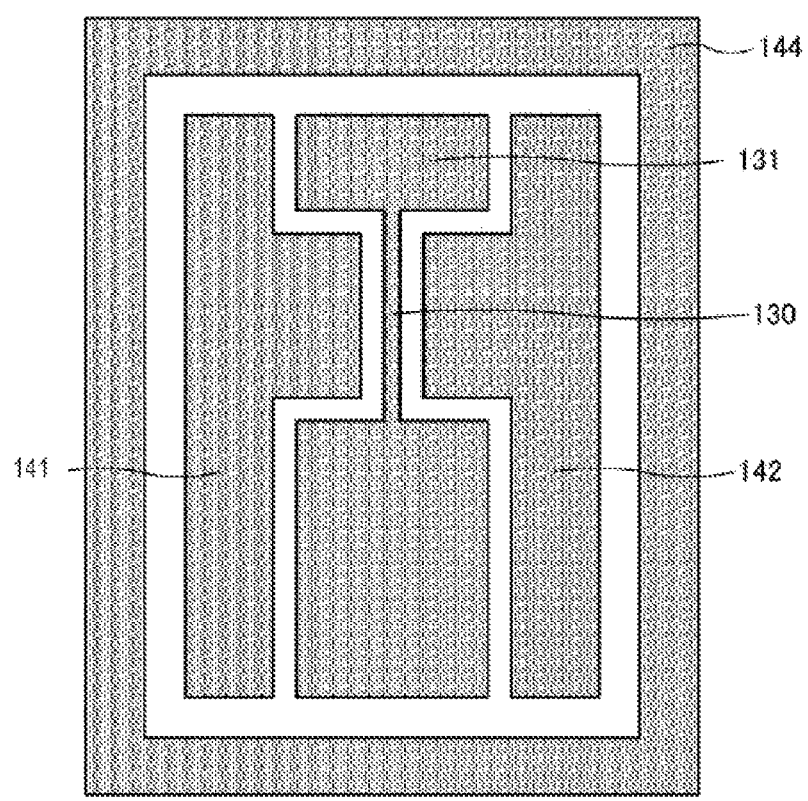
FIG. 13 is a drawing which explains an outer peripheral electrode.

Further, a part between other electrodes may be similarly buried by the polysilicon 150 and the polysilicon 150 may be doped with the impurities and connected to the reference potential to reduce the crosstalk noise through a parasitic capacity. A film of the polysilicon may be formed in such a configuration as to surround the electrode, doped with the impurities and connected to the reference potential so as to function as an electrostatic shield and reduce disturbance noise As shown in FIG. 13, an outer peripheral electrode 144 may be sometimes provided so as to surround outer sides of the resonator electrode 131, the first fixed electrode 141 and the second fixed electrode 142. The outer peripheral electrode 144 functions as the electrostatic shield together with the substrate 110 and the shell 151. In order to ensure the insulation between such an outer peripheral electrode 144 and the resonator electrode 131, the first fixed electrode 141 and the second fixed electrode 142, the present invention may be applied.

Figure 14:
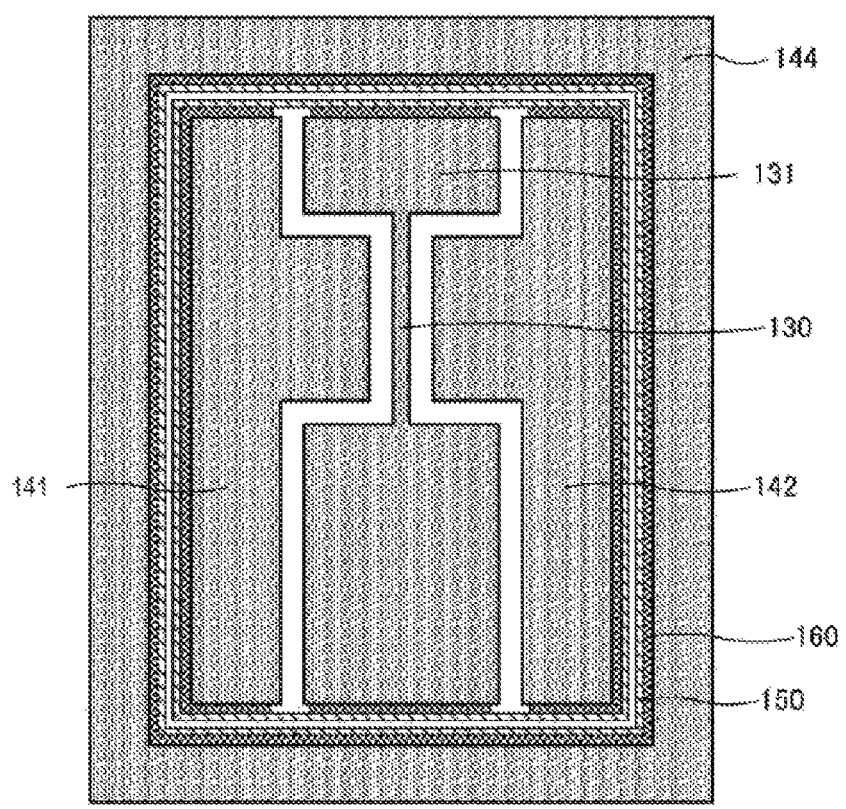
FIG. 14 is a drawing showing an example of forming a buried part of polysilicon when the outer peripheral electrode is provided.

For instance, as shown in FIG. 14, the polysilicon 150 may be buried in the oxide film 160 formed in an electrode separating gap in an inner side of the outer peripheral electrode 144 to ensure the insulation between the outer peripheral electrode 144 and the resonator electrode 131, the first fixed electrode 141 and the second fixed electrode 142, and prevent the BOX layer 111 on the lower surfaces of these electrodes from being excessively removed so that the electrodes partly float.

Figure 15:
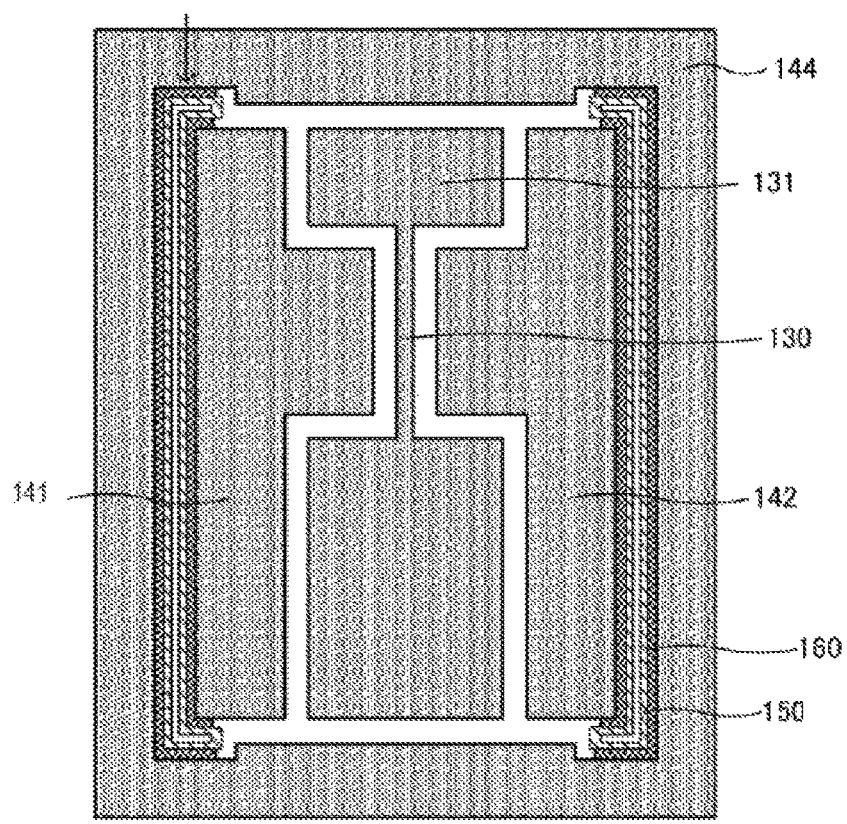
FIG. 15 is a drawing showing an example of forming a buried part of polysilicon when the outer peripheral electrode is provided.
Figure 16:
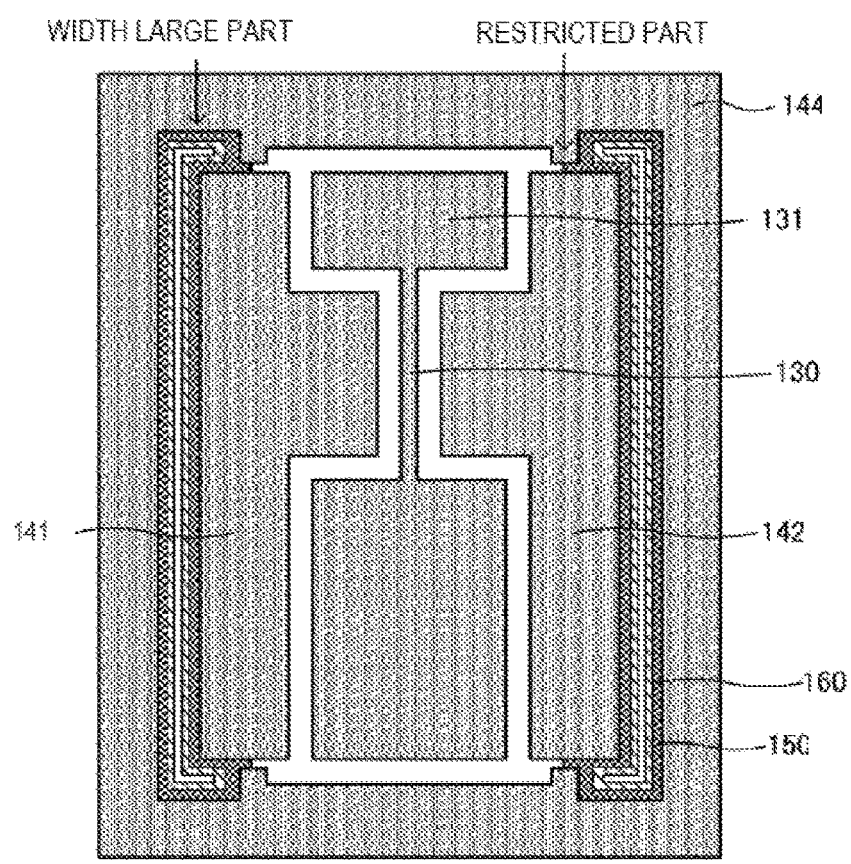
FIG. 16 is a drawing showing an example of forming a buried part of polysilicon when the outer peripheral electrode is provided.

At this time, as shown in FIG. 15, a part of the electrode separating gap between the outer peripheral electrode 144 and the resonator electrode 131, the first fixed electrode 141 and the second fixed electrode 142 may be set to a width large part to restrict an area of a buried part of the polysilicon 150. Otherwise, as shown in FIG. 16, a restricted part adjacent to the width large part may be formed to more protect the oxide film 160.

Figure 17:
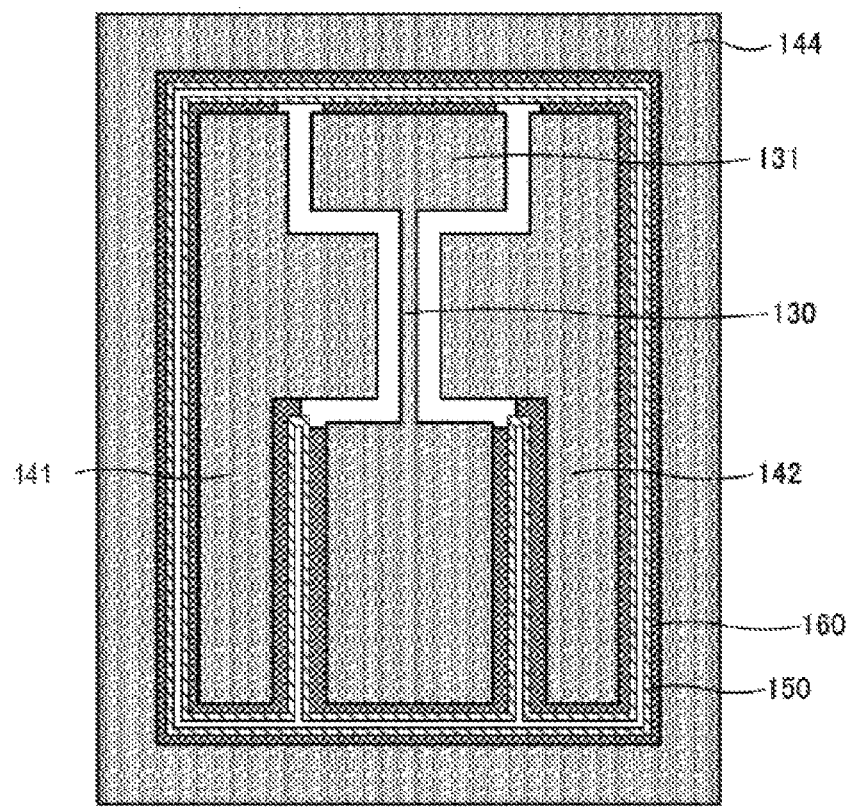
FIG. 17 is a drawing showing an example of forming a buried part of polysilicon when the outer peripheral electrode is provided.
Figure 18:
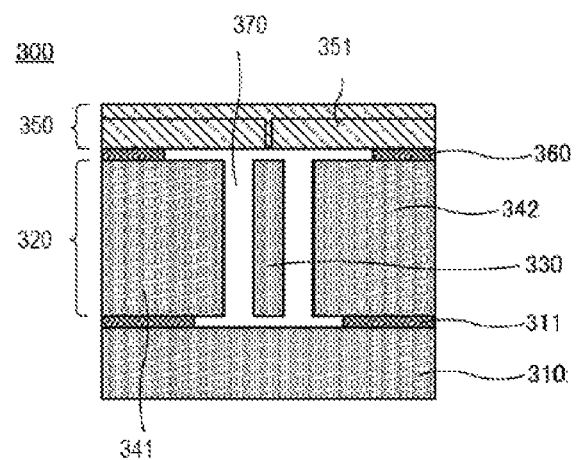
FIG. 18 is a diagram for explaining a structure of a resonant transducer in which a plane side of a long plate shaped resonator is formed vertically to a silicon substrate to vibrate the resonator in a transverse direction of the silicon substrate.
Figure 19:
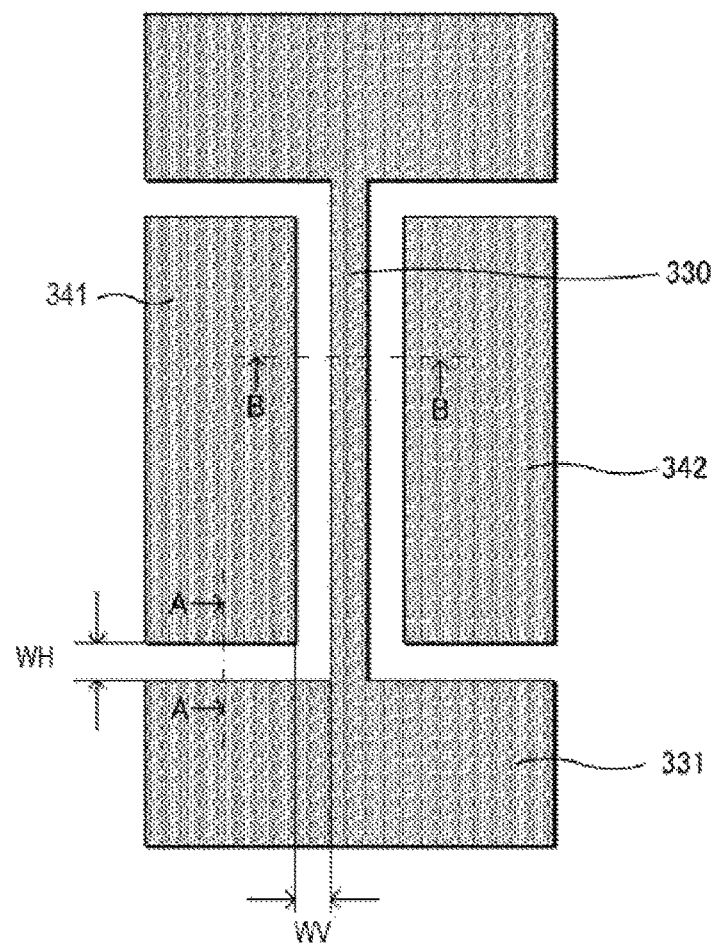
FIG. 19 is a diagram showing an example of a mask pattern of an active layer.
Figure 21A:
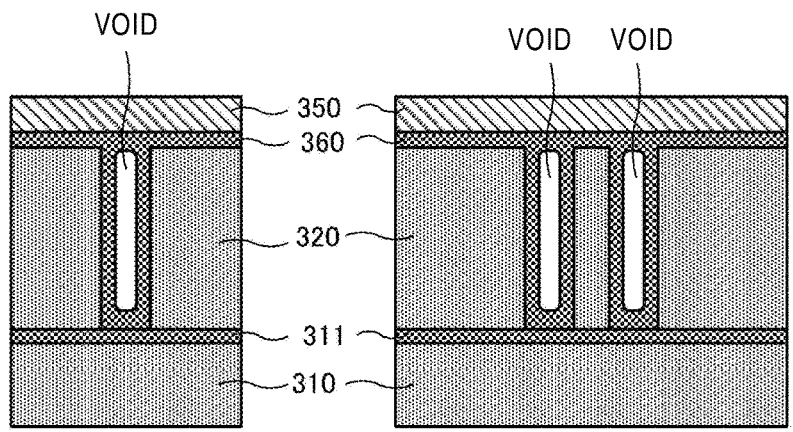
FIGS. 21A to 21C are diagrams which explain manufacturing processes of the resonant transducer.
Figure 21B:
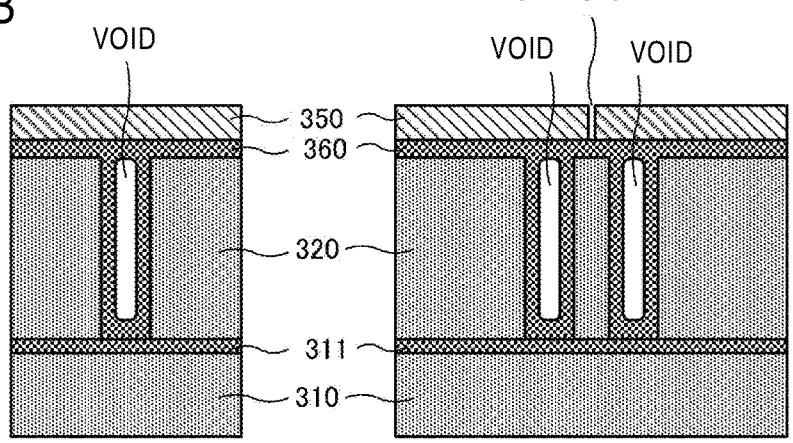
Figure 21C:
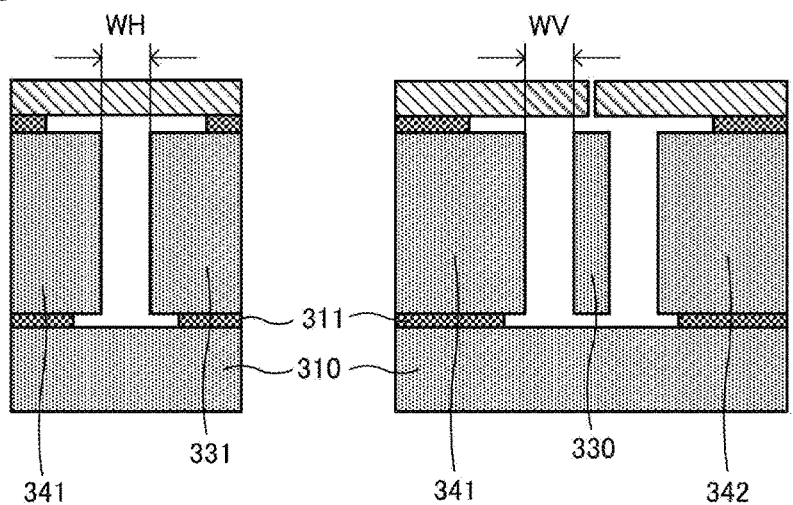
Figure 22A:
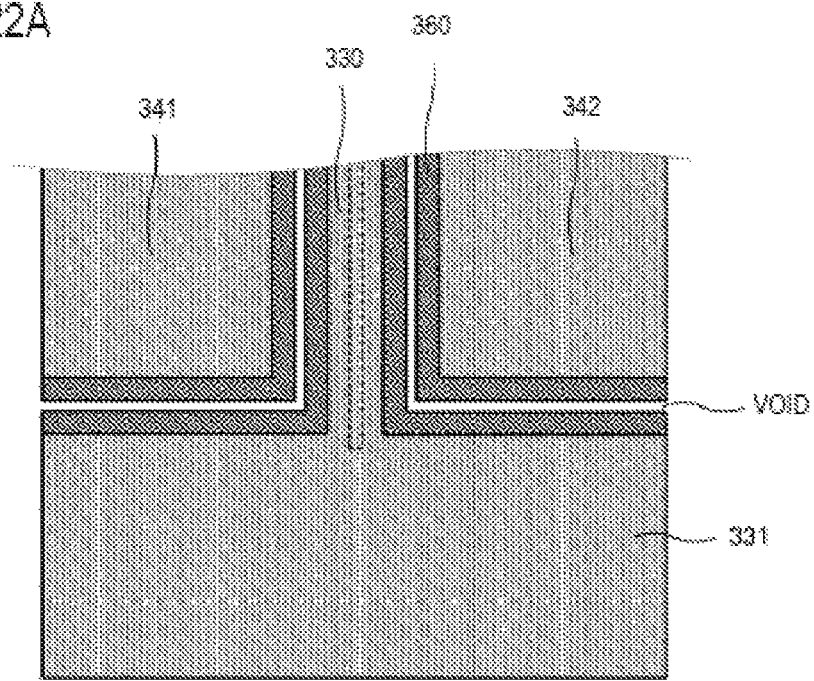
FIGS. 22A and 22B are horizontally sectional views of the active layer before and after the sacrifice layer is etched.
Figure 22B:
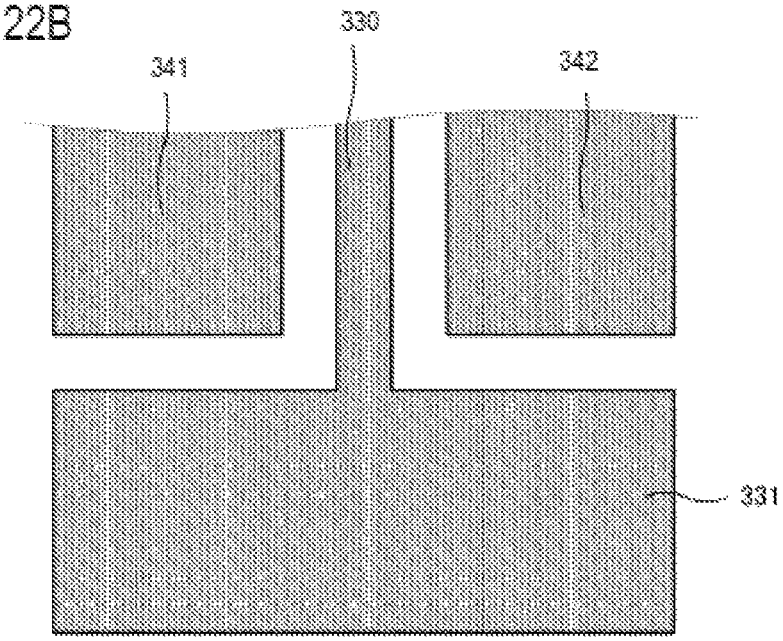

Further, as shown in FIG. 17, in the electrode separating gap between the resonator electrode 131, the first fixed electrode 141 and the second fixed electrode 142, the buried part of the polysilicon 150 may be formed.

The present invention is not limited to the above-described examples. In the present invention, the buried part of the polysilicon 150 may be formed in an arbitrary electrode separating gap. For instance, the buried parts of the polysilicon 150 may be formed in entire parts of the electrode separating gaps or the buried part of the polysilicon 150 may be formed in a part of the electrode separating gap. Thus, the insulation between arbitrary electrodes can be ensured and the BOX layer 111 on the lower surfaces of the arbitrary electrodes can be prevented from being excessively removed so that the electrodes partly float. Further, the buried part of the polysilicon 150 formed in the arbitrary electrode separating gap may be doped with the impurities and connected to the reference potential to reduce the crosstalk noise through the parasitic capacity.

What is claimed is:

1. A resonant transducer comprising:
   a resonator;
   a resonator electrode connected to an end part of the resonator;
   a fixed electrode arranged in the vicinity of the resonator; and
   a buried part formed between the fixed electrode and the resonator electrode,
   wherein the resonator, the resonator electrode and the fixed electrode are formed by the same active layer on a substrate,
   wherein a gap exists between a surface of the fixed electrode and a surface of the resonator electrode, an insulating layer being fixed in the gap; and
   wherein the buried part is formed in the gap between the surface of the fixed electrode and the surface of the resonator electrode via the insulating layer to ensure insulation between the fixed electrode and the resonator electrode.

2. The resonant transducer according to claim 1, wherein the buried part is made of polysilicon.

3. The resonant transducer according to claim 2, wherein the buried part of the polysilicon is doped with impurities and connected to a reference potential.

4. The resonant transducer according to claim 2, wherein
   the polysilicon is buried in parts between the fixed electrode and the resonator electrode; and
   a sacrifice layer is etched to release the resonator.

5. The resonant transducer according to claim 1, wherein the buried part is made of a material which can withstand vapor of hydro-fluoric acid or hydrogen fluoride.

6. The resonant transducer according to claim 5, wherein the material is any of SiC, SiGe or DLC.

7. A resonant transducer comprising:
   a resonator;
   a resonator electrode connected to an end part of the resonator;
   a fixed electrode arranged in the vicinity of the resonator;
   an outer peripheral electrode arranged in outer peripheries of the resonator electrode and the fixed electrode, a gap existing between a surface of the fixed electrode, a surface of the resonator electrode and a surface of the outer peripheral electrode, an insulating layer being fixed in the gap; and
   a buried part formed in the gap between the surfaces of any of the electrodes via the insulating layer to ensure insulation between any of the electrodes,
   wherein the resonator, the resonator electrode, the fixed electrode and outer peripheral electrode are formed by the same active layer on a substrate.

8. The resonant transducer according to claim 7, wherein the buried part is made of polysilicon.

9. The resonant transducer according to claim 8, wherein the buried part of the polysilicon is doped with impurities and connected to a reference potential.

10. The resonant transducer according to claim 8, wherein
    the polysilicon is buried in parts between any of the electrodes; and
    a sacrifice layer is etched to release the resonator.

11. The resonant transducer according to claim 7, wherein the buried part is made of a material which can withstand vapor of hydro-fluoric acid or hydrogen fluoride.

12. The resonant transducer according to claim 11, wherein the material is any of SiC, SiGe or DLC.

* * * * *